(12) United States Patent
Yabuta et al.

(10) Patent No.: US 6,746,639 B2
(45) Date of Patent: Jun. 8, 2004

(54) PROCESS FOR PREPARING POLYIMIDE FILM

(75) Inventors: Katsunori Yabuta, Otsu (JP); Kiyokazu Akahori, Otsu (JP)

(73) Assignee: Kaneka Corporation (JP)

( * ) Notice: Subject to any disclaimer, the term of this patent is extended or adjusted under 35 U.S.C. 154(b) by 95 days.

(21) Appl. No.: 09/953,077

(22) Filed: Sep. 11, 2001

(65) Prior Publication Data

US 2002/0074686 A1 Jun. 20, 2002

(30) Foreign Application Priority Data

Sep. 11, 2000 (JP) ........................................ 2000-274515

(51) Int. Cl.⁷ ................................................. B29D 7/01
(52) U.S. Cl. .............................. 264/176.1; 264/177.17; 264/211.12; 264/216
(58) Field of Search ..................... 264/176.1, 177.17, 264/211.12, 216

(56) References Cited

U.S. PATENT DOCUMENTS 4,898,753 A * 2/1990 Inoue et al. ................. 427/276
5,460,890 A * 10/1995 Okahashi et al. ........... 428/458

FOREIGN PATENT DOCUMENTS

| JP | 63-221138 | * | 9/1998 |
| JP | 11-262985 | * | 9/1999 |

* cited by examiner

*Primary Examiner*—Ana Woodward
(74) *Attorney, Agent, or Firm*—Brinks Hofer Gilson & Lione

(57) ABSTRACT

There is provided a process for preparing a polyimide film by a method of casting a film, wherein bubble inclusion and unevenness in thickness are prevented without decrease in mechanical strength at the same time. It is an object of the present invention to provided a process for preparing a polyimide film characterized by extruding, casting and forming into a film a composition of a resin solution obtained by adding, to low viscosity varnish obtained by polymerizing a tetracarboxylic dianhydride component with a diamine component in a molar ratio of 1:1.01 to 1:1.05, or 1:0.95 to 1:0.99, a dehydrating agent in a molar ratio of at least one time and a chemically-imidizing catalyst in a molar ratio of at least half time based on 1 mole of the amic acid of the poly(amic acid) varnish.

6 Claims, 1 Drawing Sheet

PROCESS FOR PREPARING POLYIMIDE FILM

BACKGROUND OF THE INVENTION

The present invention relates to a process for preparing a polyimide film by a casting process with a T-die in extrusion. Specifically, the present invention relates to a process for preparing a polyimide film, wherein bubbles are prevented from being mixed into a resin solution (referred to as "curtain" in the present specification) which is extruded from a die in a T-die method, and unevenness in thickness is controlled, and wherein mechanical properties, especially tensile strength, of the polyimide film to be obtained are prevented from decreasing.

Among plastic materials, polyimides have excellent properties in heat resistance, insulating properties, solvent resistance and low temperature resistance, and are used as a material for electrical and electronic parts. Specifically, they are used for flexible print circuit, base films in TAB carrier tape, coating materials of electric cables for aircraft and the like, base films in magnetic recording tape, coating materials of superconducting coil wire, and the like. A polyimide film suitable for each purpose is selected appropriately for the above various purposes.

In accordance with miniaturization and thin filming in electrical and electronic parts, line thinning of circuit is in progress. Dimensional change of materials during use may cause accidents such as disconnection and short-circuit in thinly lined circuit structure. Therefore, highly accurate dimensional stability is required for materials used for electrical and electronic parts.

Meanwhile, as shown in FIG. 1, a polyimide film is prepared as follows. A polyimide precursor, i.e., a composition of poly(amic acid) solution is mixed with a chemically-imidizing catalyst in an extrusion machine 2; the mixture is spread from the extrusion machine 2 in the cross direction; and then the mixture is extruded continuously into a smooth, thin film through a die lip 6, namely, a narrow slit space set on a slit die 4 on an endless belt 10. Then, in the progress of imidizing the above composition of poly(amic acid) solution, a resin film 8 is hardened by drying and cooling to such a degree that the resin achieves self supportability; and further, the hardened resin is heat-treated to prepare a polyimide film.

However, in the above process for preparing a polyimide film, an acid dianhydride component and a diamine component are normally mixed in almost equimolar amount, specifically in a component ratio ranging from about 1:0.095 to 1:1.005 as raw materials of a poly(amic acid) composition to obtain the poly(amic acid) composition. The poly(amic acid) composition is usually a viscous liquid whose viscosity is adjusted to at least 2,500 poise. The viscosity of a liquid or slurry composition of a resin solution is usually in the range of 500 to 2,000 poise when it is extruded from the slit die after mixing the above poly(amic acid) composition and the chemically-imidizing agent.

Also, a polyimide film is obtained by casting a poly(aimic acid) composition which is a polyimide precursor according to a casting method with a T-die. Thereafter, imidization is completed through film forming, heating and drying, to obtain a polyimide film. During the casting step, if imidizing reaction of the poly(amic acid) composition proceeds rapidly, a resin film is partially imidized, leading to problems with generation of gel defect parts in a film as well as formation of coating streaks since the slit die is clogged with the gel generated by the partial imidization of the poly(amic acid)composition. Therefore, in order to control the imidizing reaction of the poly(amic acid)composition, the composition of poly(amic acid) solution is generally cooled to at most 0° C. Viscosity of the composition of poly(amic acid) solution tends to become considerably high due to the cooling.

A composition of a resin solution has elasticity when it has a relatively high viscosity such as the above, namely, 500 to 2,000 poise. Therefore, as shown in FIG. 2, curtain 22 which is a fluid composition of a resin solution extruded from the die lip 6 is drawn to machine direction as the speed of an endless belt 210 accelerates. Once the curtain 22 is drawn to the machine direction, an angle θ formed when the curtain 22 reaches the endless belt 10 becomes smaller. Accordingly, when the curtain 22 reaches the surface of the endless belt 10, air is easily included between the curtain 22 and the endless belt.

As a result, air can be included between the prepared resin film 8 and the endless belt 10, and foamed projection parts having large and small sizes may remain on the surface of the resin film 8. The inclusion of bubbles causes to deteriorate surface properties of resin film remarkably. For example, in the drying step of the above resin film, the film thickness of the projected part becomes thin, the included air is expanded to break some part of the resin film, and defective parts are generated.

Further, since the above-mentioned high viscosity curtain has stronger elasticity and larger adhesive strength to the belt than low viscosity curtain, it is drawn to the machine direction depending on the movement of the belt. However, when the curtain is drawn to the machine direction for at least a certain distance, the reaching point of curtain varies periodically since reverse force is generated against the machine direction due to the elasticity of the resin film. The periodic variance causes variation in thickness of the resin film to be prepared, and therefore periodic unevenness in thickness is generated in the machine direction, resulting in the problem that such unevenness appears as striping on the surface of the film as the final product.

In response to this problem, Japanese Unexamined Patent Publication 198157/1999 discloses a process for casting a film in which viscosity of a composition of a resin solution in a die is lowered. The process aims at preventing bubble inclusion at casting a resin film, improving uneven thickness and promoting production efficiency of the film even in a process for casting a film at high speed. As a process for lowing viscosity of a composition of a resin solution in a die, there are disclosed a process for decreasing polymerization degree of a composition of a resin solution and a process for increasing the ratio of the solvent in the composition of a resin solution.

However, a polyimide film prepared according to the process for lowering the polymerization degree disclosed in Japanese Unexamined Patent Publication 198157/1999 had a problem that mechanical properties of the film are significantly reduced compared with a polyimide film prepared from equimolar diamine component and tetracarboxylic dianhydride component. Also, in the process for increasing the ratio of the solvent in the composition of a resin solution disclosed in Japanese Unexamined Patent Publication 198157/1999, temperature of the belt needs to be raised high in order to dry the resin on the endless belt to such a degree that self supportability is achieved, and in consequence, mechanical properties of the polyimide film to be obtained is lowered.

As mentioned above, in the process for casting a film in which inclusion of bubbles are prevented at casting a resin film and uneven thickness is improved, there is a problem that mechanical properties of the polyimide film to be obtained are lowered significantly. The lowering of the mechanical properties causes to disturb stable production due to generation of waviness made by film extension in the process of producing flexible printcircuit, base films in TAB carrier tape, coating materials of electric cables for aircraft and the like, base films in magnetic recording tape, coating materials of superconducting coil wire, and the like. Also, mechanical properties of products made therefrom are lowered even to make the products unreliable.

SUMMARY OF THE INVENTION

The present invention is to provide a process for preparing a polyimide film wherein inclusion of bubbles are prevented at resin film casting, and uneven thickness is improved especially in such a cast film forming process for preparing polyimide film at high speed as the above without the lowering of mechanical properties as seen in the process for casting a film disclosed in Japanese Unexamined Patent Publication 198157/1999 at the same time.

The present invention has been carried out to solve the above problems. The process for preparing a polyimide film of the present invention relates to a process for preparing a polyimide film by extruding and casting a composition of a resin solution containing a poly(amic acid) varnish, which comprises a step for preparing the poly(amic acid) varnish which is a varnish having low viscosity by polymerizing a tetracarboxylic dianhydride component with a diamine component in a molar ratio of 1:1.01 to 1:1.05, or 1:0.95 to 1:0.99, and a step for preparing the composition of a resin solution by adding, to the poly(amic acid) varnish, a dehydrating agent in a molar ratio of at least 1 time and a chemically-imidizing catalyst in a molar ratio of at least half time based on 1 mole of the amic acid of the poly(amic acid) varnish.

It is preferable that viscosity of the poly(amic acid) varnish is at most 2,000 poise at 20° C.

It is also preferable that viscosity of the poly(amic acid) varnish is at most 1,500 poise at 20° C.

It is preferable that viscosity of the poly(amic acid) varnish is 100 to 1,500 poise at 20° C.

It is preferable that the composition of a resin solution is obtained by adding the dehydrating agent of at least 1.2 to 5 times and the chemically-imidizing catalyst of at least 0.6 to 2.0 times in molar ratio based on 1 mole of the amic acid of the poly(amic acid) varnish.

It is preferable that the chemically-imidizing catalyst is a tertiary amine.

DETAILED DESCRIPTION

Figure 1:
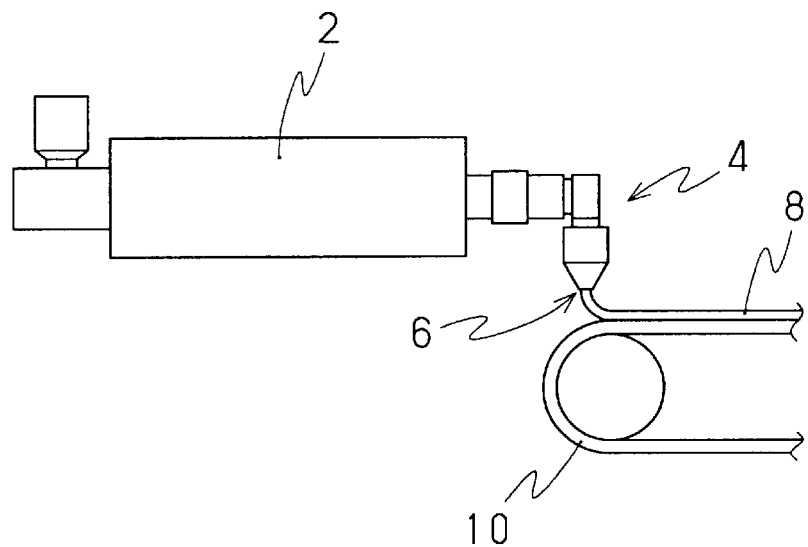
FIG. 1 is a view showing a process for preparing a polyimide film.
Figure 2:
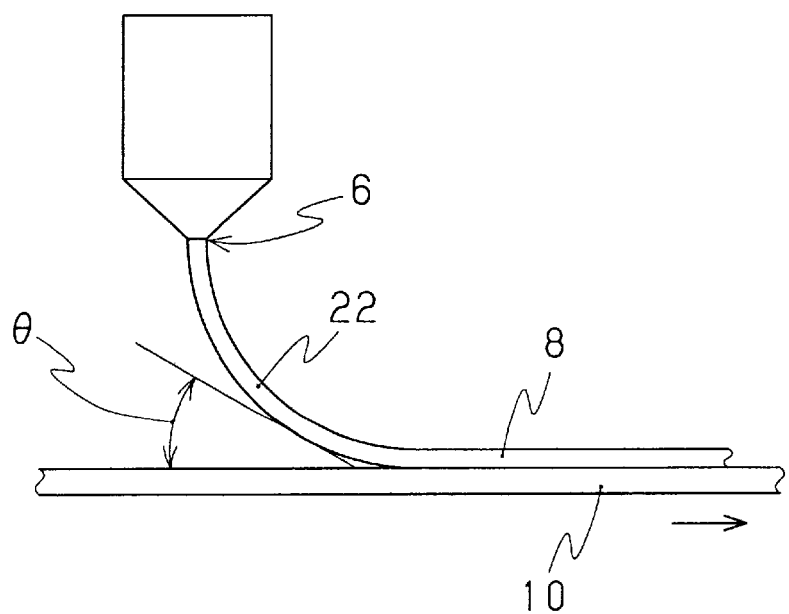
FIG. 2 is a view showing the state of curtain extruding from a die lip according to a process for casting a film.

Embodiments of the process for preparing polyimide film of the present invention are explained below. "Curtain" in this specification means a fluid composition of a resin solution shaped like a curtain which exists in air gap space between a slit die from which the composition is extruded and a belt which the composition reaches.

The process for preparing polyimide film of the present invention is as follows. A tetracarboxylic dianhydride component is mixed with a diamine component, and a composition of a resin solution containing a poly(amic acid) varnish comprising a poly(amic acid) is prepared by polymerization of the above two components. While the above composition of a resin solution is extruded, cast and film-formed, the poly(amic acid) is imidized to prepare a polyimide film.

Herein, the present invention is characterized in that the process includes a step for preparing low viscosity poly (amic acid) varnish by polymerizing a tetracarboxylic dianhydride component and a diamine component by arranging the component ratio to a specific range.

The imidizing reaction of the poly(amic acid) obtained in the above method is carried out by a chemical method to add a dehydrating agent and a chemically-imidizing catalyst to the poly(amic acid) varnish. Another characteristic of the present invention is that a composition of a resin solution is prepared by adding the dehydrating agent and the chemically-imidizing agent used for the imidization of the poly(amic acid) in a specific ratio. By extruding, casting and film-forming this composition of a resin solution, it is possible to obtain a polyimide film whose mechanical properties are not lowered, inclusion of bubbles being prevented at the casting of a resin film and uneven thickness being improved.

Hereinafter, embodiments of the process for preparing a polyimide film is specifically explained.

The ratio of the tetracarboxylic dianhydride component and the diamine component which are the raw materials of poly(amic acid) is in the range of 1:1.01 to 1:1.05 or 1:0.95 to 1:0.99 in molar ratio. The above molar ratio is preferably in the range of 1:1.01 to 1:1.03 or 1:0.97 to 1:0.99. When diamine component is less than 1.01 mole approaching 1.00 mole based on 1 mole of the tetracarboxylic dianhydride component, viscosity of poly(amic acid) varnish to be obtained becomes higher. In this case, it is impossible to obtain an excellent polyimide film because the intact varnish causes to include bubbles at casting a resin film and to generate uneven thickness. Then, even though the high viscosity varnish is diluted by a solvent, the ratio of the solvent in the low viscosity varnish to be obtained is increased. Therefore, in order to dry the above varnish on the endless belt to such a degree that it achieves self supportability, temperature of the belt needs to be raised, resulting in remarkable decrease in mechanical properties of the polyimide film to be obtained. Specifically, tensile strength of the polyimide film obtained by dilution is lower than 90% of that of the polyimide film prepared from poly(amic acid) varnish which is not diluted.

Also, as to the component ratio of the tetracarboxylic dianhydride component and the diamine component, when the diamine component is more than 1.05 mole or less than 0.95 mole based on 1 mole of the tetracarboxylic dianhydride component, polymerization degree of the poly(amic acid) varnish to be obtained is low, resulting in remarkable decrease in mechanial properties of the polyimide film to be obtained. Specifically, tensile strength of the polyimide film to be obtained is lower than 90% of that of the polyimide film prepared by a usual non-fast casting method in which poly(amic acid) varnish is prepared by polymerizing a tetracarboxylic dianhydride component and a diamine component in an almost equimolar ratio, specifically, in a molar ratio of 1:1 to 1:1.005 or 1:0.995.

Any known polymerization method can be used, but the following methods are particularly preferable. That is, (1) a method of polymerization in which aromatic diamine dissolved in an organic polar solvent is allowed to react with aromatic tetracarboxylic dianhydride in an amount substantially equimolar therewith; (2) a method of polymerization in which aromatic tetracarboxylic dianhydride is allowed to react with an aromatic diamine compound in an organic polar solvent in an amount under-molar therewith to obtain a pre-polymer having a dianhydride group at both ends, and in which polymerization is performed using an aromatic diamine compound so that amounts of aromatic tetracarboxylic dianhydride and the aromatic diamine compound can be substantially equimolar in whole processes; (3) a method of polymerization in which aromatic tetracarboxylic dianhydride is allowed to react with an aromatic diamine compound in an organic polar solvent in an amount excess-molar therewith to obtain a pre-polymer having an amino group at both ends, and in which an additional aromatic diamine compound is added thereto and polymerization is preformed using aromatic tetracarboxylic dianhydride so that amounts of aromatic tetracarboxylic dianhydride and the aromatic diamine compound can be substantially equimolar in whole processes; (4) a method of polymerization in which aromatic tetracarboxylic dianhydride is dissolved and/or dispersed in an organic polar solvent and then polymerization is performed using an aromatic diamine compound so that the amounts can be substantially equimolar; (5) a method of polymerization in which a mixture of aromatic tetracarboxylic dianhydride and aromatic diamine in substantially equimolar amounts is allowed to react in an organic polar solvent; and the like.

Any method can be used as long as a molar ratio between dianhydride and a diamine compound is in the range of 1:1.01 to 1:1.05, or 1:0.95 to 1:0.99.

Basically, the poly(amic acid) varnish is obtained by polymerizing, in an organic polar solvent, aromatic tetracarboxylic dianhydride represented by pyromellitic dianhydride with aromatic diamine represented by 4,4'-diaminodiphenyl ether and paraphenylenediamine in the state of uniform dissolution in the above organic polar solvent. The method of polymerizing a tetracarboxylic dianhydride component with a diamine component is not particularly limited, and the polymerization can be conducted by any known method. For example, one or two kinds of diamine are dispersed in an organic solvent in the state of solution or slurry under inert gas such as argon or nitrogen. To the solution is added at least one of tetracarboxylic dianhydride in the state of solid, solution with an organic solvent or slurry to obtain poly(amic acid) varnish. In this case, the reaction temperature is preferably −20° C. to 50° C., more preferably at most 20° C. The reaction time is preferably one to two hours.

On the contrary, tetracarboxylic dianhydride may be dissolved or dispersed in an organic solvent at first, and then diamine in the state of solid, solution with an organic solvent or slurry may be added to the solution. Also, the two components can be added at the same time. The order of adding the tetracarboxylic dianhydride component and the diamine component is not limited.

Examples of the aromatic tetracarboxylic dianhydride component are pyromellitic dianhydride, 2,3,6,7-naphthalenetetracarboxylic dianhydride, 3,3',4,4'-biphenyl tetracarboxylic dianhydride, 1,2,5,6-naphthalenetetracarboxylic dianhydride, 2,2',3,3'-biphenyl tetracarboxylic dianhydride, 3,3',4,4'-benzophenonetetracarboxylic dianhydride, oxydiphthalic dianhydride; aromatic diester tetracarboxylic dianhydride such as 2,2-bis(3,4-dicarboxyphenyl)propane dianhydride, p-phenylene bis(trimellitic acid monoesteracid dianhydride), 1,4-naphthalene bis(trimellitic acid monoesteracid dianhydride), 2,6-naphthalene bis(trimellitic acid monoesteracid dianhydride), and 4,4-biphenylene bis (trimellitic acid monoesteracid dianhydride); and the like. These can be used alone or in combination of two or more. Also, examples of the aliphatic tetracarboxylic dianhydride are 1,2,3,4-cyclobutanetetracarboxylic dianhydride, 1,2,3,4-cyclopentanetetracarboxylic dianhydride, 1,2,4,5-cyclohexanetetracarboxylic dianhydride, 2,3,5-tricarboxycyclopentyl acetic acid dianhydride, 3,4-dicarboxy-1,2,3,4-tetrahydro-1-naphthalene succinic acid dianhydride, and the like. These can be used alone or in combination of two or more. Among these, pyromellitic dianhydride, 3,3',4,4'-benzophenonetetracarboxylic dianhydride, 3,3',4,4'-biphenyl tetracarboxylic dianhydride, and p-phenylene bis(trimellitic acid monoesteracid dianhydride) are preferable from the viewpoint of heat resistance, mechanical strength, dimension stability, resistant property at low temperature in the composition of poly(amic acid) as a precursor of polyimide used in the present invention.

Examples of the aromatic diamine component are 4,4'-diaminodiphenyl ether, paraphenylenediamine, metaphenylenediamine, 4,4'-diaminodiphenylmethane, 4,4'-diaminodiphenylpropane, 4,4'-diaminodiphenyl sulfone, 3,3'-diaminodiphenyl sulfone, 4,4'-diaminodiphenyl sulfide, 3,3'-dimethyl-4,4'-diaminobiphenyl, 2,2-bis[4-(4-aminophenoxy)phenyl]propane, 4,4'-bis(4-aminophenoxy) biphenyl, 3,3'-dimethoxybenzidine, diaminonaphthalene, and the like. These can be used alone or in combination of two or more.

Examples of the aliphatic diamine are bis(4-aminocyclohexyl)methane, bis(4-amin-3-methylcyclohexyl)methane, tetramethylene diamine, hexamethylene diamine, diaminosiloxane, and the like. These can be used alone or in combination of two or more. Among these, 4,4'-diaminodiphenyl ether and paraphenylenediamine are preferable from the viewpoint of heat resistance, mechanical strength, dimension stability, resistant property at low temperature. A mixture, which is obtained by mixing these two diamines in an amount of 100:0 to 0:100, preferably 100:0 to 10:90, can be preferably used.

Examples of the organic polar solvent used for the polymerization of the poly(amic acid) are sulfoxide solvents such as diaminoethyl sulfoxide, formamide solvents such as N,N-dimethylformamide, acetoamide solvents such as N,N-dimethylacetoamide, pyrrolidone solvents, phenol solvents and the like. These organic polar solvents can be used alone, as a mixed solvent comprising at least two of these, or further by mixing aromatic hydrocarbon. Among these, N,N,dimethylformamide and N,N-dimethylacetoamide are preferable.

The concentration of solid material of the poly(amic acid) in the above poly(amic acid) varnish is preferably 12.5 to 30% by weight, more preferably 15 to 25% by weight, most preferably 15 to 20% by weight. When the concentration of the solid material of the poly(amic acid) in the varnish is less than 12.5% by weight, temperature of the belt needs to be raised to dry the varnish on the endless belt so that it achieves self supportability, resulting in a tendency that mechanical properties of the polyimide film to be obtained are remarkably decreased. Specifically, tensile strength of the polyimide film obtained in this case is lower than 90% of that of the polyimide film prepared by a usual non-fast casting method in which poly(amic acid) varnish is prepared by polymerizing a tetracarboxylic dianhydride component and a diamine component in an almost equimolar ratio, specifically, in a molar ratio of 1:1 to 1.005 or 1:1 to 0.995. On the other hand, when the concentration of the solid material of the poly(amic acid) in the varnish is more than 30% by weight, required low viscosity varnish cannot be obtained, resulting in tendencies that film thickness unevenness in the machine direction remarkably increases and that bubble inclusion occurs easily.

Herein, viscosity of the poly(amic acid) varnish obtained by polymerizing a tetracarboxylic dianhydride component and a diamine component in a molar ratio adjusted to 1:1.01 to 1:1.05 or 1:0.95 to 1:0.99 is preferably at most 2,000 poise, more preferably at most 1,500 poise, most preferably 100 to 1,500 poise at 20° C. Polymerization degree of the poly(amic acid) obtained by polymerization in this adjusted range is relatively low. When viscosity is more than 2,000 poise, there is a tendency that film thickness unevenness in the machine direction remarkably increases, and it is not preferable since bubble inclusion into the resin film occurs easily. On the other hand, when viscosity is less than 100 poise, stability of curtain extruded from a die cannot be maintained and stable film forming becomes difficult in the casting process with a die of the present invention. These viscosity values are measured by a Brookfield type viscometer.

Viscosity of the above poly(amic acid) varnish is adjusted by controlling polymerization degree of an acid dianhydride component and a diamine component which are materials of the poly(amic acid) to a specific molar ratio and by regulating concentration of solid content.

In the next place, a film is formed by chemical imidization of the above poly(amic acid) into polyimide. The chemical imidization means to add a chemically-imidizing agent comprising a dehydrating agent and a chemically-imidizing catalyst to the poly(amic acid). In the present invention, a composition of a resin solution is prepared by adding a dehydrating agent in a molar ratio of at least one time and a chemically-imidizing catalyst in a molar ratio of at least half time based on 1 mole of the amic acid of the poly(amic acid) varnish. To the poly(amic acid) are added the dehydrating agent of preferably at least 1.2 to 5 times, more preferably 1.0 to 4 times, particularly 1.2 to 3 times and the chemically-imidizing catalyst of preferably at least 0.6 to 2.0 times, more preferably 0.5 to 1.5 times, particularly 0.5 to 1.2 times in molar ratio based on 1 mole of the amic acid of the poly(amic acid) varnish. If the amount of the dehydrating agent is out of this range, mechanical properties of the film tend to decrease. If the amount of the chemically-imidizing catalyst is less than this amount, mechanical properties of the film tend to decrease. If the amount is more than this amount, chemical imidizing reaction suddenly proceeds and it becomes impossible to cast it from a die. Examples of the dehydrating agent to be used are organic carboxylic anhydrides, N,N'-dialkylcarbodiimides, lower fatty acid halides, halogenated lower fatty acid anhydride, arylphosphonic acid dihalide and thionyl halide. Among these, organic carboxylic anhydrides are preferable.

Examples of the organic carboxylic anhydrides are acetic anhydride, propionic anhydride, butyric anhydride, valeric anhydride, and the mixture of intermolecular anhydride and organic carboxylic anhydride thereof. Also, examples are carboxylic acid anhydrides of aromatic monocarboxylic acid such as benzoic acid or naphthoic acid, the mixture thereof, and the mixture of organic carboxylic anhydrides, and carboxylic acid anhydride of carbonic acid, formic acid, and aliphatic ketenes (ketenes, and dimethyl ketene), the mixture thereof and organic carboxylic anhydride, and the like. Among these, acetic anhydride is preferable.

The amount of the above dehydrating agent is preferably at least 1 time, more preferably 1.2 to 5 times in molar ratio based on 1 mole of the amic acid of the poly(amic acid) varnish. When the amount of the dehydrating agent is less than 1 time in molar ratio based on 1 mole of the amic acid of the poly(amic acid) varnish, there is a tendency that imidization does not proceed sufficiently, resulting in remarkable decrease in mechanical properties of the polyimide film to be obtained. On the other hand, when the amount of the dehydrating agent is more than 5 times, temperature of the belt needs to be raised to evaporate the extra portion of the dehydrating agent, and in consequence, mechanical properties of the polyimide film to be obtained tend to be remarkably decreased. Specifically, tensile strength of the polyimide film to be obtained is lower than 90% of that of the polyimide film prepared by a usual non-fast casting method in which poly(amic acid) varnish is prepared by polymerizing a tetracarboxylic dianhydride component and a diamine component in an almost equimolar ratio, specifically, in a molar ratio of 1:1 to 1:1.005 or 1:1 to 1:0.995.

Among the above chemically-imidizing catalyst, tertiary amines are preferable. Examples of the above tertiary amines are trimethylamine, triethylamine, triethylenediamine, pyridine, picoline, quinoline, isoquinoline, lutidine and the like. Preferable examples are pyridine, β-picoline, γ-picoline, quinoline and isoquinoline. Among these, isoquinoline is preferable.

The amount of the above chemically-imidizing catalyst is preferably at least half time, more preferably 0.6 to 2 times in molar ratio based on 1 mole of the amic acid of the poly(amic acid) varnish. When the amount of the chemically-imidizing catalyst is less than half time in molar ratio based on 1 mole of the amic acid of the poly(amic acid) varnish, mechanical properties of the polyimide film to be obtained is remarkably decreased. Specifically, tensile strength of the polyimide film to be obtained is lower than 90% of that of the polyimide film prepared by a usual non-fast casting method in which poly(amic acid) varnish is prepared by polymerizing a tetracarboxylic dianhydride component and a diamine component in an almost equimolar ratio, specifically, in a molar ratio of 1:1 to 1:1.005 or 1:1 to 1:0.995. The upper limit of the amount of the chemically-imidizing catalyst is preferably 2.0 times. Even if more than 2.0 times of the chemically-imidizing catalyst is added, there is no significant difference in imidizing effect compared to the case where 2.0 times of the chemically-imidizing catalyst is added. Instead, when the amount of the chemically-imidizing catalyst is more than 2.0 times, some portion of the chemically-imidizing catalyst remains in the film and possibly contaminates product line as impurities during steps of preparing print circuit substrates and the like.

The chemically-imidizing agent comprising a dehydrating agent and a chemically-imidizing catalyst may be added to poly(amic acid) varnish directly, but may be dissolved in an organic solvent and then added to poly(amic acid) varnish. Examples of the above organic solvent are N,N-dimethylformamide, N,N-dimethylacetamide, N,N-diethylformamide, N,N-diethylacetamide, N-methylmethoxyacetamide, N-methyl-caprolactam, N-methyl-2-pyrrolidone, tetramethylurea, and the like. These can be used in combination with benzene, benzonitrile, dioxane, xylene, toluene, cyclohexane, and the like. Among these, N,N-dimethylformamide is preferable.

For the purpose of forming a polyimide film stably, fillers such as calcium hydrogen phosphate, silica, mica, titanium oxide, alumina and glass beads may be further added to the above poly(amic acid) varnish.

Subsequently, the above composition of a resin solution obtained by mixing the poly(amic acid) varnish with the chemically-imidizing agent is continuously extruded from a slit die as smooth, thin film curtain and cast on an endless belt. Thereafter, the curtain is dried and heated to form a film of polyimide(amic acid) having self supportability. Then, the film of polyimide(amic acid) is further heat-treated, and a polyimide film having mechanical properties required in the present invention is prepared. At the heat treatment the final heating temperature is preferably 400 to 650° C., more preferably 450 to 600° C., most preferably 480 to 580° C. The heating time is preferably 1 to 600 seconds, preferably 5 to 400 seconds, most preferably 5 to 300 seconds. When the temperature is higher and/or the time is longer than the above, heat deterioration of a film is more likely to occur. When the temperature is lower and/or the time is shorter than the above, characteristics such as mechanical strength tend to decrease.

In the above process, viscosity of composition of a resin solution obtained by mixing the poly(amic acid) varnish with the chemically-imidizing agent in the die is preferably at most 450 poise, more preferably at most 300 poise, most preferably 50 to 300 poise. When the viscosity of the composition of a resin solution is more than 450 poise, unevenness in film thickness increases remarkably, and it is not preferable since bubble inclusion into the resin film occurs easily. On the other hand, when the viscosity of the composition of a resin solution is less than 50 poise, stable film forming becomes difficult in the casting process with a die of the present invention. These viscosity values are measured by a Brookfield type viscometer.

The viscosity of the composition of a resin solution in a die is measured within 2 minutes after mixing the poly(amic acid) varnish with the chemically-imidizing agent.

Temperature of the above composition of a resin solution in a die is preferably at most 20° C., more preferably −10° C. to 10° C. When the temperature of the above composition of a resin solution is more than 20° C. in the die, a resin film is partially imidized, leading to problems with generation of gel defect parts in a film as well as formation of coating streaks since the slit die is clogged with the gel generated by the partial imidization of the poly(amic acid) composition. Also, the case where the temperature of the above composition of a resin solution is less than −10° C. in the die is not preferable since the viscosity of the composition of a resin solution becomes more than 450 poise.

Thickness of polyimide films which can be prepared according to the process of the present invention is not particularly limited. Generally, the thickness of a polyimide film is about 5 to 250 $\mu$m, but preferably in the range of about 5 to 100 $\mu$m. When the film thickness is less than 5 $\mu$m, curtain also becomes thin in thickness to be easily affected by wind and the like, resulting in a tendency that bubbles are easily included. Also, when the film thickness is more than 250 $\mu$m, the amount of extrusion increases to make the curtain thick and heavy, and thus there is no problem with bubble inclusion. In this way, it is possible to obtain a polyimide film whose unevenness in thickness in the machine direction is as small as at most 2.0 $\mu$m, preferably at most 1.8 $\mu$m, more preferably 1.6 $\mu$m in R value.

The process for preparing a polyimide film according to the present invention has been explained so far, but the present invention is not limited thereto. The process can be carried out in various embodiments which are improved, modified and changed based on knowledge of persons skilled in the art within the scope of the present invention.

Hereinafter, concrete explanations are made as to the examples, but the present invention is not limited to these examples. "Part(s)" and "%" in examples mean "part(s) by weight" and "% by weight", respectively, unless otherwise specified.

[Evaluation Method]

1) Measurement of tensile strength

Tensile strength was measured according to ASTM D882.

2) Thickness in machine direction

The center part of the obtained polyimide film was taken out for 5 m in the machine direction as a sample. By using a contact and continuous measuring type thickness meter (film thickness tester KG601A made by Anritsu Corporation), the maximum thickness and minimum thickness was determined from a chart. The thickness in the machine direction was calculated with R as an index of unevenness in thickness by an equation: R value=(maximum thickness)−(minimum thickness). The unit is "$\mu$m".

EXAMPLE 1

Pyromellitic dianhydride as aromatic tetracarboxylic dianhydride and 4,4'-diaminodiphenyl ether as aromatic diamine were added to DMF in a molar ratio of aromatic tetracarboxylic dianhydride to aromatic diamine of 1:1.02, and the mixture was polymerized. To the obtained poly(amic acid) DMF solution (concentration of solid content: 20%; viscosity at 20° C.: 800 poise) was added an imidizing agent comprising 200 g of acetic anhydride, 100 g of isoquinoline and 190 g of DMF, in an amount of 40% by weight based on the poly(amic acid) DMF solution to obtain a composition of a resin solution. Next, the above composition of a resin solution was stirred rapidly by using a mixer, extruded from a T-die and cast on a stainless endless belt running 20 mm below the die. In this case, temperature of the resin solution in the T-die was 0° C. and viscosity of the resin solution was 150 poise at the temperature. Also, the molar ratio of acetic anhydride as the dehydrating agent was 1.67 times, the molar ratio of isoquinoline as the catalyst was 0.66 time based on 1 mole of the amic acid of the poly(amic acid) varnish.

The resin film was dried and imidized at 130° C. for 100 seconds, 300° C. for 20 seconds, 450° C. for 20 seconds and 500° C. for 20 seconds to obtain a polyimide film having an average film thickness of 25 $\mu$m. R value of the film was 1.5 and tensile strength of the film was 255 MPa in the machine direction.

EXAMPLE 2

Pyromellitic dianhydride as aromatic tetracarboxylic dianhydride, and 4,4'-diaminodiphenyl ether and paraphenylenediamine in a molar ratio of 3:1 as aromatic diamine were added to DMF in a molar ratio of aromatic tetracarboxylic dianhydride to aromatic diamine of 1:0.98, and the mixture was polymerized. To the obtained poly(amic acid) DMF solution (concentration of solid content: 20%; viscosity at 20° C.: 1,000 poise) was added an imidizing agent comprising 200 g of acetic anhydride, 110 g of isoquinoline and 180 g of DMF, in an amount of 40% by weight based on the poly(amic acid) DMF solution to obtain a composition of a resin solution. Next, the above composition of a resin solution was stirred rapidly by using a mixer, extruded from a T-die and cast on a stainless endless belt running 20 mm below the die. In this case, the temperature of the resin solution in the T-die was 0° C. and the viscosity of the resin solution was 180 poise at the temperature.

Also, the molar ratio of acetic anhydride as the dehydrating agent was 1.58 times, the molar ratio of isoquinoline as the catalyst was 0.69 time based on 1 mole of the amic acid of the poly(amic acid) varnish. The resin film was dried and imidized at 130° C. for 100 seconds, 250° C. for 20 seconds, 400° C. for 20 seconds and 520° C. for 20 seconds to obtain a polyimide film having an average film thickness of 25 μm. R value of the film was 1.7 and tensile strength of the film was 310 MPa in the machine direction.

EXAMPLE 3

Pyromellitic dianhydride as aromatic tetracarboxylic dianhydride and 4,4'-diaminodiphenyl ether as aromatic diamine were added to DMF in a molar ratio of aromatic tetracarboxylic dianhydride to aromatic diamine of 1:1.02, and the mixture was polymerized. To the obtained poly(amic acid) DMF solution (concentration of solid content: 20%; viscosity at 20° C.: 800 poise) was added an imidizing agent comprising 180 g of acetic anhydride, 130 g of isoquinoline and 190 g of DMF, in an amount of 50% by weight based on the poly(amic acid) DMF solution to obtain a composition of a resin solution. Next, the above composition of a resin solution was stirred rapidly by using a mixer, extruded from a T-die and cast on a stainless endless belt running 15 mm below the die. In this case, the temperature of the resin solution in the T-die was 0° C. and the viscosity of the resin solution was 100 poise at the temperature.

Also, the molar ratio of acetic anhydride as the dehydrating agent was 1.76 times, the molar ratio of isoquinoline as the catalyst was 1.01 time based on 1 mole of the amic acid of the poly(amic acid) varnish. The resin film was dried and imidized at 140° C. for 100 seconds, 300° C. for 20 seconds, 450° C. for 20 seconds and 500° C. for 20 seconds to obtain a polyimide film having an average film thickness of 25 μm. R value of the film was 1.7 and tensile strength of the film was 255 MPa in the machine direction.

COMPARATIVE EXAMPLE 1

Pyromellitic dianhydride as aromatic tetracarboxylic dianhydride and 4,4'-diaminodiphenyl ether as aromatic diamine were added to DMF in a molar ratio of aromatic tetracarboxylic dianhydride to aromatic diamine of 1:1.02, and the mixture was polymerized. To the obtained poly(amic acid) DMF solution (concentration of solid content: 20%; viscosity at 20° C.: 800 poise) was added a chemically-imidizing agent comprising 300 g of acetic anhydride, 40 g of isoquinoline and 150 g of DMF, in an amount of 40% by weight based on the poly(amic acid) DMF solution to obtain a composition of a resin solution. Next, the above composition of a resin solution was stirred rapidly by using a mixer, extruded from a T-die and cast on a stainless endless belt running 20 mm below the die. In this case, the temperature of the resin solution in the T-die was 0° C. and the viscosity of the resin solution was 150 poise at the temperature.

Also, the molar ratio of acetic anhydride as the dehydrating agent was 2.51 times, the molar ratio of isoquinoline as the catalyst was 0.27 time based on 1 mole of the amic acid of the poly(amic acid) varnish. The resin film was dried and imidized at 130° C. for 100 seconds, 300° C. for 20 seconds, 450° C. for 20 seconds and 500° C. for 20 seconds to obtain a polyimide film having an average film thickness of 25 μm. R value of the film was 1.5 and tensile strength of the film was 185 MPa in the machine direction.

COMPARATIVE EXAMPLE 2

Pyromellitic dianhydride as aromatic tetracarboxylic dianhydride and 4,4'-diaminodiphenyl ether and paraphenylenediamine in a molar ratio of 3:1 as aromatic diamine were added to DMF in a molar ratio of aromatic tetracarboxylic dianhydride to aromatic diamine of 1:0.98, and the mixture was polymerized. To the obtained poly(amic acid) DMF solution (concentration of solid content: 20%; viscosity at 20° C.: 1,000 poise) was added an imidizing agent comprising 300 g of acetic anhydride, 40 g of isoquinoline and 150 g of DMF, in an amount of 40% by weight based on the poly(amic acid) DMF solution to obtain a composition of a resin solution. Next, the above composition of a resin solution was stirred rapidly by using a mixer, extruded from a T-die and cast on a stainless endless belt running 20 mm below the die. In this case, the temperature of the resin solution in the T-die was 0° C. and the viscosity of the resin solution was 200 poise at the temperature. Also, the molar ratio of acetic anhydride as the dehydrating agent was 2.37 times, the molar ratio of isoquinoline as the catalyst was 0.27 time based on 1 mole of the amic acid of the poly(amic acid) varnish. The resin film was dried and imidized at 130° C. for 100 seconds, 250° C. for 20 seconds, 400° C. for 20 seconds and 520° C. for 20 seconds to obtain a polyimide film having an average film thickness of 25 μm. R value of the film was 1.7 and tensile strength of the film was 210 MPa in the machine direction.

COMPARATIVE EXAMPLE 3

Pyromellitic dianhydride as aromatic tetracarboxylic dianhydride and 4,4'-diaminodiphenyl ether as aromatic diamine were added to DMF in a molar ratio of aromatic tetracarboxylic dianhydride to aromatic diamine of 1:1.005, and the mixture was polymerized. To the obtained poly(amic acid) DMF solution (concentration of solid content: 20%; viscosity at 20° C.: 4,000 poise) was added DMF of 100% by weight to dilute the mixture, and a poly(amic acid) DMF solution was prepared (concentration of solid content: 10%; viscosity at 20° C.: 1,000 poise). Thereto was added an imidizing agent comprising 300 g of acetic anhydride, 40 g of isoquinoline and 150 g of DMF, in an amount of 20% by weight based on the poly(amic acid) DMF solution to obtain a composition of a resin solution. Next, the above composition of a resin solution was stirred rapidly by using a mixer, extruded from a T-die and cast on a stainless endless belt running 20 mm below the die. In this case, temperature of the resin solution in the T-die was 0° C. and viscosity of the resin solution was 200 poise at the temperature.

Also, the molar ratio of acetic anhydride as the dehydrating agent was 2.5 times, the molar ratio of isoquinoline as the catalyst was 0.26 time based on 1 mole of the amic acid of the poly(amic acid) varnish. In this case, the drying temperature needed to be raised higher in order to dry the composition on the endless belt until self supportability was achieved. Compared to 130° C. in Comparative Example 1, the temperature needed to be 160° C. in this case. The resin film was dried and imidized at 160° C. for 100 seconds, 300° C. for 20 seconds, 450° C. for 20 seconds and 500° C. for 20 seconds to obtain a polyimide film having an average film thickness of 25 μm. R value of the film was 1.6 and tensile strength of the film was 210 MPa in the machine direction.

COMPARATIVE EXAMPLE 4

Pyromellitic dianhydride as aromatic tetracarboxylic dianhydride and 4,4'-diaminodiphenyl ether as aromatic diamine were added to DMF in a molar ratio of aromatic tetracarboxylic dianhydride to aromatic diamine of 1:1.005, and the mixture was polymerized. To the obtained poly(amic acid) DMF solution (concentration of solid content: 20%; viscosity at 20° C.: 4,000 poise) was added an imidizing agent comprising 300 g of acetic anhydride, 40 g of isoquinoline and 150 g of DMF, in an amount of 40% by weight based on the poly(amic acid) DMF solution to obtain a composition of a resin solution. Next, the above composition of a resin solution was stirred rapidly by using a mixer, extruded from a T-die and cast on a stainless endless belt running 20 mm below the die. In this case, temperature of the resin solution in the T-die was 0° C. and viscosity of the resin solution was 880 poise at the temperature.

Also, the molar ratio of acetic anhydride as the dehydrating agent was 2.51 times, the molar ratio of isoquinoline as the catalyst was 0.27 time based on 1 mole of the amic acid of the poly(amic acid) varnish. The resin film was dried and imidized at 130° C. for 100 seconds, 300° C. for 20 seconds, 450° C. for 20 seconds and 500° C. for 20 seconds to obtain a polyimide film having an average film thickness of 25 $\mu$m. R value of the thickness in the machine direction was turned out to be 3.3 $\mu$m when the value was measured by taking out the center part of the film for 5 m in the machine direction as a sample. In examination of the film, numerous bubbles having a diameter of about 5 mm were observed to be included at the both ends of the film. Tensile strength of the film was 255 MPa in the machine direction.

Except for Comparative Example 4, no bubble inclusion was observed at casting, and unevenness in thickness was as small as at most 2.0 $\mu$m in R value of the thickness in the machine direction in any of Comparative Examples 1 to 3 and Examples 1 to 3.

As mentioned above, according to the present invention, there can be provided a process for preparing a polyimide film wherein production efficiency can be increased by a stable cast film forming method of high processability. In the process, bubble inclusion is prevented and unevenness in thickness is controlled by adjusting viscosity to low values, and decrease in mechanical properties, especially tensile strength, of the polyimide film which occurred in die cast processes for preparing a polyimide film with fast casting can be prevented.

What is claimed is:

1. A process for preparing a polyimide film by extruding and casting a composition of a resin solution containing a poly(amic acid) varnish, comprising:

preparing the poly(amic acid) varnish having low viscosity by polymerizing a tetracarboxylic dianhydride component with a diamine component in a molar ratio of 1:1.01 to 1:1.05 or 1:0.95 to 1:0.99, and preparing the composition of the resin solution by adding to the poly(amic acid) varnish a dehydrating agent in an amount of at least one mole and a chemically-imidizing catalyst in an amount of at least 0.5 mole per 1 mole of amic acid of the poly(amic acid) varnish.

2. The process of claim 1, wherein viscosity of said poly(amic acid) varnish is at most 2,000 poise at 20° C.

3. The process of claim 1, wherein viscosity of said poly(amic acid) varnish is at most 1,500 poise at 20° C.

4. The process of claim 1, wherein viscosity of said poly(amic acid) varnish is 100 to 1,500 poise at 20° C.

5. The process of claim 1, wherein said composition of the resin solution is obtained by adding the dehydrating agent in an amount of 1.2 to 5 moles and the chemically-imidizing catalyst in an amount of 0.6 to 2.0 moles per 1 mole of the amic acid of the poly(amic acid) varnish.

6. The process of claim 1, wherein said chemically-imidizing catalyst is a tertiary amine.

* * * * *

(12) INTER PARTES REEXAMINATION CERTIFICATE (1061st)
United States Patent
Yabuta et al.

(10) Number: US 6,746,639 C1
(45) Certificate Issued: Mar. 6, 2015

(54) PROCESS FOR PREPARING POLYIMIDE FILM

(75) Inventors: Katsunori Yabuta, Otsu (JP); Kiyokazu Akahori, Otsu (JP)

(73) Assignee: Kaneka Corporation, Kita-Ku, Osaka-Shi, Osaka-Fu (JP)

Reexamination Request:
No. 95/001,709, Aug. 15, 2011

Reexamination Certificate for:
Patent No.: 6,746,639
Issued: Jun. 8, 2004
Appl. No.: 09/953,077
Filed: Sep. 11, 2001

(30) Foreign Application Priority Data

Sep. 11, 2000 (JP) ................................. 2000-274515

(51) Int. Cl.
*B29C 47/88* (2006.01)
*C08J 5/18* (2006.01)
*C09D 179/08* (2006.01)
*H05K 1/03* (2006.01)
*H05K 3/02* (2006.01)
*C09D 179/00* (2006.01)
*B29C 47/00* (2006.01)

(52) U.S. Cl.
CPC .............. *C08J 5/18* (2013.01); *B29C 47/0021* (2013.01); *C09D 179/08* (2013.01); *B29C 47/885* (2013.01); *H05K 1/0346* (2013.01); *C08J 2379/08* (2013.01); *H05K 3/022* (2013.01)
USPC .............. 264/176.1; 264/177.17; 264/211.12; 264/216

(58) Field of Classification Search
None
See application file for complete search history.

(56) References Cited

To view the complete listing of prior art documents cited during the proceeding for Reexamination Control Number 95/001,709, please refer to the USPTO's public Patent Application Information Retrieval (PAIR) system under the Display References tab.

*Primary Examiner* — Jerry D Johnson

(57) ABSTRACT

There is provided a process for preparing a polyimide film by a method of casting a film, wherein bubble inclusion and unevenness in thickness are prevented without decrease in mechanical strength at the same time. It is an object of the present invention to provided a process for preparing a polyimide film characterized by extruding, casting and forming into a film a composition of a resin solution obtained by adding, to low viscosity varnish obtained by polymerizing a tetracarboxylic dianhydride component with a diamine component in a molar ratio of 1:1.01 to 1:1.05, or 1:0.95 to 1:0.99, a dehydrating agent in a molar ratio of at least one time and a chemically-imidizing catalyst in a molar ratio of at least half time based on 1 mole of the amic acid of the poly(amic acid) varnish.

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1-6 are cancelled.

* * * * *